(12) United States Patent
Abe et al.

(10) Patent No.: US 6,583,029 B2
(45) Date of Patent: Jun. 24, 2003

(54) PRODUCTION METHOD FOR SILICON WAFER AND SOI WAFER, AND SOI WAFER

(75) Inventors: Takao Abe, Gunma-ken (JP); Tokio Takei, Nagano-ken (JP); Keiichi Okabe, Nagano-ken (JP); Hajime Miyajima, Nagano-ken (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 27 days.

(21) Appl. No.: 09/926,645

(22) PCT Filed: May 27, 2001

(86) PCT No.: PCT/JP01/02448
§ 371 (c)(1),
(2), (4) Date: Nov. 28, 2001

(87) PCT Pub. No.: WO01/73831
PCT Pub. Date: Oct. 4, 2001

(65) Prior Publication Data
US 2003/0008478 A1 Jan. 9, 2003

(30) Foreign Application Priority Data
Mar. 27, 2001 (JP) .......................................... 2000-90803
Mar. 29, 2001 (JP) .......................................... 2000-91882

(51) Int. Cl.$^7$ ........................ H01L 21/30; H01L 21/46; H01L 21/302; H01L 21/461
(52) U.S. Cl. ...................... 438/455; 438/706; 438/753; 438/906
(58) Field of Search ............................ 438/455, 690, 438/691, 692, 693, 706, 753, 906

(56) References Cited

U.S. PATENT DOCUMENTS

| | | | |
|---|---|---|---|
| 5,152,857 A | * | 10/1992 | Ito et al. ............... 148/DIG. 12 |
| 5,254,830 A | | 10/1993 | Zarowin et al. |
| 5,374,564 A | | 12/1994 | Bruel |
| 5,494,862 A | * | 2/1996 | Kato et al. ................... 438/693 |
| 5,766,065 A | | 6/1998 | Hasegawa et al. |
| 5,928,066 A | | 7/1999 | Hasegawa et al. |
| 5,942,445 A | * | 8/1999 | Kato et al. ................... 438/691 |
| 6,312,797 B1 | | 11/2001 | Yokokawa et al. |
| 6,352,927 B2 | * | 3/2002 | Kishimoto ................... 438/690 |

FOREIGN PATENT DOCUMENTS

| | | |
|---|---|---|
| EP | 0451993 | 10/1991 |
| EP | 0533551 | 3/1993 |
| EP | 0720891 | 7/1996 |
| FR | 2681472 | 3/1993 |

(List continued on next page.)

OTHER PUBLICATIONS

English Language Abstract of JP 60–50970.
English Language Abstract of JP 6–176993.
English Language Abstract of JP 11–26336.

(List continued on next page.)

Primary Examiner—John F. Niebling
Assistant Examiner—Walter L. Lindsay, Jr.
(74) Attorney, Agent, or Firm—Greenblum & Bernstein, P.L.C.

(57) ABSTRACT

There are provided a method for manufacturing a mirror polished wafer with little polishing sag (peripheral sag) by a relatively easy method, a method for manufacturing a bonded wafer having an SOI layer or a bond layer which has no periphery removing region or reduces it, and a bonded wafer thereof.

There is prepared a silicon wafer having chamfered portions in which when the chamfering width of the front surface side of the silicon wafer is X1 and the chamfering width of the back surface side thereof is X2, X1<X2, the front surface of the silicon wafer is mirror polished, and the front surface side thereof is chamfered again so that the chamfering width thereof is X3 (X3>X1).

23 Claims, 7 Drawing Sheets

| | FOREIGN PATENT DOCUMENTS | |
|---|---|---|
| JP | 59214554 | 12/1984 |
| JP | 60-50970 | 3/1985 |
| JP | 61256621 | 11/1986 |
| JP | 3-280538 | 12/1991 |
| JP | 4-4742 | 1/1992 |
| JP | 2565617 | 6/1993 |
| JP | 5-160074 | 6/1993 |
| JP | 5-46086 | 7/1993 |
| JP | 5-211128 | 8/1993 |
| JP | 6-36413 | 5/1994 |
| JP | 6-176993 | 6/1994 |
| JP | 8-168946 | 7/1996 |
| JP | 9-251934 | 9/1997 |
| JP | 11-26336 | 1/1999 |
| JP | 5-226305 | 9/1999 |

OTHER PUBLICATIONS

English Language Abstract of JP 61–256621.
English Language Abstract of JP 5–211128.
English Language Abstract of JP 8–168946.
English Language Abstract of JP 5–160074.
English Language Abstract of JP 9–251934.
English Language Abstract of JP 59–214554.
English Language Abstract of JP 3–280538.
English Language Abstract of JP 11–26336.
English Language Abstract of JP 5–226305.
English Language Abstract of JP 5–211128.
English Language Abstract of JP 8–168946.

* cited by examiner

PRODUCTION METHOD FOR SILICON WAFER AND SOI WAFER, AND SOI WAFER

TECHNICAL FIELD

The present invention relates to a method for manufacturing a silicon wafer and a bonded wafer such as a bounded SOI (silicon on insulator) wafer and a direct bond wafer. More specifically, the present invention relates to a silicon wafer which reduces polishing sag generated in the peripheral portion of the wafer, a bonded SOI wafer and a direct bond wafer which have no periphery removing region or reduce it, and a manufacturing method thereof.

BACKGROUND ART

A typical process for manufacturing a silicon mirror wafer is known to have a slice step for slicing a silicon single crystal ingot in a wafer shape using a wire saw or an inner diameter slicer, a chamfering step for chamfering the peripheral portion of the wafer for preventing cracks or fractures of the sliced wafer, a lapping step for lapping the wafer using loose abrasives to enhance flatness, an etching step for etching the wafer using an acid solution or an alkaline solution to remove processing deformation, and a mirror polishing step for polishing at least one of the surfaces thereof.

Figure 5:
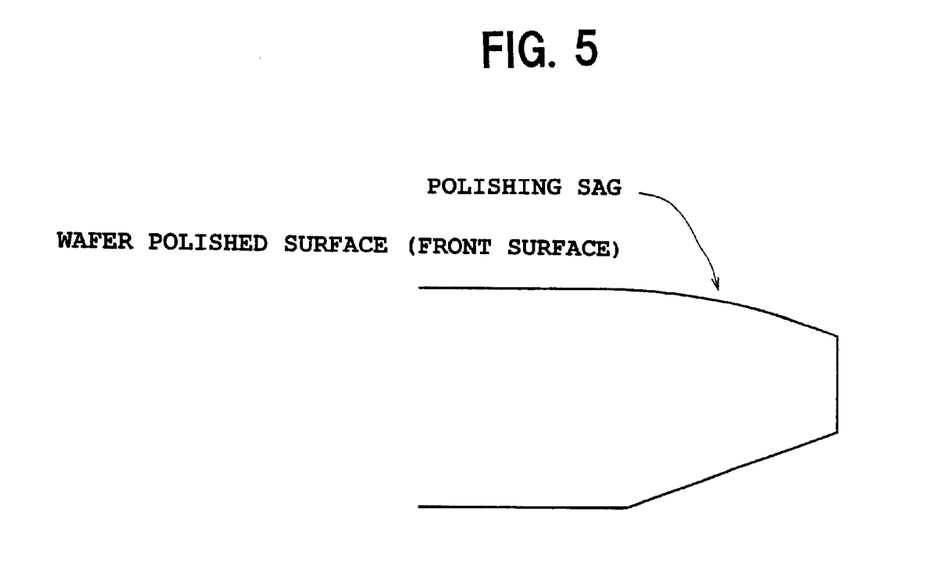
FIG. 5 is a diagram of assistance in explaining polishing sag generated in a mirror polishing process.

In the mirror polishing step, since a hard silicon wafer is mirror finished with a soft polishing cloth by mechanochemical polishing, a region called polishing sag (hereinafter, also called peripheral sag) as shown in FIG. 5 exists in the peripheral portion thereof. The polishing sag which affects device fabrication is desirably eliminated to a minimum. Only mechanical polishing must be performed in order to thoroughly remove polishing sag. Even when using a processing method in a ductile mode which is a method for preventing crack damage by machining, the processing generates dislocation which must be removed by mechanochemical polishing. As a result, the polishing sag cannot be avoided.

Such a silicon mirror wafer is used to manufacture a bonded SOI wafer. The bonded SOI wafer is a technique for bonding two silicon wafers together via a silicon oxide film. As disclosed in Japanese Patent Publication No. Hei 5-46086, there has been known a method in which an oxide film is formed on at least one of the two wafers, the wafers are closely contacted with each other so as not to contain any foreign matters between the surfaces to be bonded, and they are subjected to a heat treatment at a temperature of 200 to 1200° C. to enhance the bonding strength.

The bonded wafer whose bonding strength is enhanced by performing a heat treatment can be subjected to later grinding and polishing processes. The thickness of the device fabrication side wafer is reduced to a desired thickness by grinding and polishing to form an SOI layer for device forming.

Since both the wafer surfaces before being bonded are mirror finished by mechanochemical polishing as described above, polishing sag exists in the peripheral portion thereof. An unbonded region of, e.g., about 1 to 3 mm is generated in the peripheral portion of the bonded wafer manufactured by bonding both the wafers together.

When one of the wafers is ground and polished while the unbonded region remains, the unbonded region is separated in the process, so that damage or particle attachment adversely will affect the device forming region. The unbonded region must be removed previously.

Japanese Laid-Open Patent Publication No. Hei 6-176993 proposes a method for manufacturing a bonded wafer in which two silicon wafers are closely contacted with each other via an oxide film, a region including an unbonded region of the periphery of a bonded wafer whose bonding strength is enhanced by subjecting the silicon wafers to a heat treatment in an oxidizing atmosphere is ground from the front surface side of the bond wafer (a first silicon wafer as a device region) in the thickness direction to a portion immediately before a bonding interface between the bond wafer and the base wafer (a second silicon wafer as a support), the bond wafer is etched to the bonding interface so as to thoroughly remove the unbonded region, and the bond wafer is ground and polished to reduce its thickness to a desired thickness.

According to this method, the unbonded region can be removed without changing the shape of the base wafer. As a periphery removing width for thoroughly removing the unbonded region, a portion of at least 3 mm from the peripheral edge of the bond wafer is typically removed in view of safety.

Also is known a technique for reducing an unbonded region (Japanese Laid-Open Patent Publication No. Hei 11-26336) in which a joined wafer is subjected to a heat treatment in an oxidizing atmosphere so as to fill an unbonded region of the periphery thereof with a thermal oxide film. A thermal oxidation treatment must be performed at high temperatures for a long time in order to sufficiently fill the unbonded region with the thermal oxide film, and enough bonding strength cannot be obtained. As a further method, Japanese Patent Publication No. Hei 4-4742 describes a technique for removing an unbonded region in which two wafers are bonded together, and the peripheral portions of both the wafers are ground at the same time to reduce the diameter of the wafers.

This method can obtain an SOI wafer having no periphery removing region in an SOI layer, as disclosed in the Japanese Laid-Open Patent Publication No. Hei 6-176993. A wafer having a diameter larger than the standard diameter of an SOI wafer to be manufactured must be used as a raw material wafer.

In addition, there has been known a method for manufacturing a direct bond wafer in which silicon wafers are directly contacted with each other without interposing an oxide film, and they are subjected to a heat treatment to enhance the bonding strength. There is the same problem as that of the bonded SOI wafer with respect to the unbonded region of the peripheral portion of a thickness-reduced layer (bond layer).

In recent years, with high-integration and high-speed of semiconductor devices, the thickness of the SOI layer must be made smaller and improve the film thickness uniformity. Specifically, the film thickness and the film thickness uniformity of about 0.1±0.01 μm are required.

In order that the thin film SOI wafer having such a film thickness and film thickness uniformity is realized by a bonded wafer, the prior art process for reducing the thickness using grinding and polishing cannot be employed. As a new thin-film technique, there is developed a method called an ion implantation separation method (also called a Smart Cut (trademark) method) disclosed in Japanese Laid-Open Patent Publication No. Hei 5-211128.

This ion implantation separation method is a technique that comprises forming an oxide film on at least one of two silicon wafers, implanting at least one of hydrogen ions or rare gas ions into one of the silicon wafers (hereinafter, also called a bond wafer) from its upper surface to form a fine bubble layer (enclosed layer) inside the silicon wafer, bringing the ion-implanted surface into contact with the other wafer (hereinafter, also called a base wafer) via the oxide film, then subjecting the wafers to a heat treatment (separation heat treatment) to separate one of the wafer as a thin-film at the fine bubble layer as a cleavage plane (separating plane), and further subjecting them a heat treatment (bonding heat treatment) for firmly bonding them to obtain an SOI wafer.

In this method, silicon wafers can be directly bonded together without interposing an oxide film. This method is used not only in the case of bonding the silicon wafers together, but also in the case of implanting ions into a silicon wafer to be bonded to an insulator wafer such as quartz, silicon carbide, and alumina having different thermal expansion coefficients. There has recently been also known a method for manufacturing an SOI wafer in which hydrogen ions are excited to perform ion implantation in a plasma state for separation at room temperature without adding a special heat treatment.

According to this method, the separated plane is a good mirror surface, and an SOI wafer having extremely high uniformity of the SOI layer can be obtained relatively easily. The one separated wafer can also be reused, so that the material can be used effectively.

When the wafer is separated in a thin film form, the unbonded region of the peripheral portion is separated at the bonded surface. The above-mentioned step for removing an unbonded region of the peripheral portion is unnecessary. This is one of the important advantages of the ion implantation separation method along with the advantages of the film thickness uniformity of the SOI layer and recycle of the material.

When the peripheral portion of the SOI wafer manufactured by the ion implantation separation method is actually observed, the peripheral edge of the SOI layer is found to be positioned in a region at a distance of about 1 mm inwardly from the peripheral edge of the base wafer. This shows that the region at a distance of about 1 mm from the peripheral edge is not bonded and separated by the influence of polishing sag of the peripheral portions of the bonded wafers.

The unbonded width from the peripheral edge depends on the degree of the polishing sag. In the case of using a typical silicon mirror-polished wafer, the unbonded width is found to be typically about 1 mm and about 2 mm at the maximum.

As described above, the prior art bonded SOI wafer uses typical mirror-polished wafers as its raw material. Due to the peripheral sag of the wafer, the effective area of the SOI layer is reduced about 1 to 3 mm from the periphery. Otherwise, when attempting to make it possible to use the wafer to the maximum peripheral portion, this requires a process in which a wafer having a diameter slightly larger than the standard diameter of a typical mirror-polished wafer is prepared and bonded, and then, an unbonded region is removed to finish the wafer so as to have the standard diameter. Thus, the cost is increased, and the method cannot be a realistic manufacturing method for mass production of wafers.

A direct bond wafer manufactured by directly contacting silicon wafers with each other without interposing an oxide film has the same problem as that of the bonded SOI wafer with respect to the unbonded region of the peripheral portion of the thickness-reduced layer (bond layer).

The present invention has been made in such problems, and an object of the present invention is to provide a method for manufacturing a mirror-polished wafer with little peripheral sag by a relatively easy method. Another object of the present invention is to provide a method for manufacturing a bonded wafer having an SOI layer or a bond layer which has no periphery removing region or reduces it and a bonded wafer thereof by applying the above-mentioned method to a method for manufacturing a bonded SOI wafer or a direct bond wafer.

DISCLOSURE OF THE INVENTION

Figure 4:
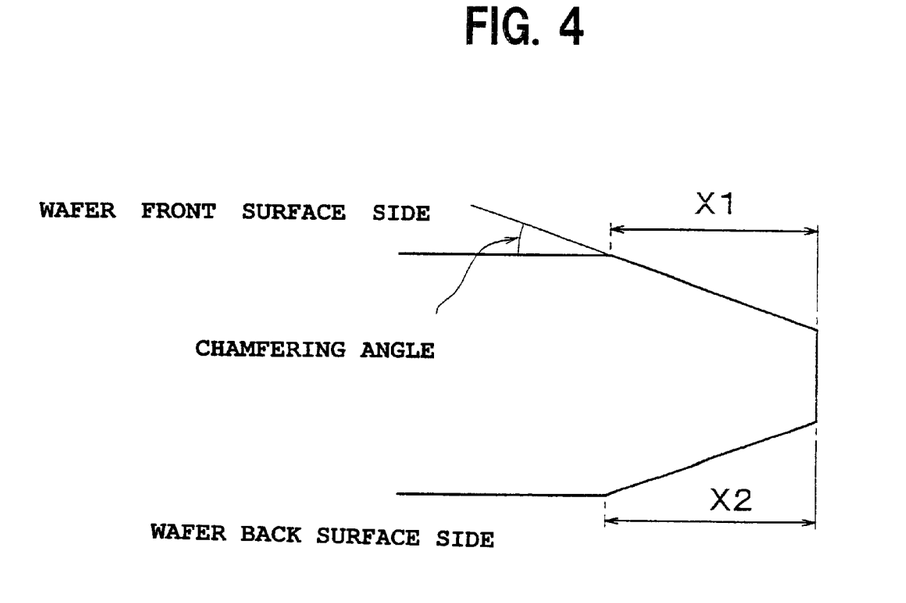
FIG. 4 is a diagram of assistance in explaining chamfering in the peripheral portions of the front and back surfaces of a wafer.

The present inventors have focused on the chamfering shape before mirror polishing in order to reduce polishing sag of a mirror polished wafer. In the chamfering width of the chamfered portions of a mirror polished wafer manufactured by a typical manufacturing process, as shown in FIG. 4, the size ratio of a chamfering width X1 of the wafer front surface side to a chamfering width X2 of the wafer back surface side is often X1=X2 (for example, 300±200 $\mu$m). Chamfering is performed at least before mirror polishing the front surface. In some applications, X1 and X2 maybe set to different values. Also in this case, chamfering is typically performed before mirror polishing the front surface. In the name of mirror chamfering, the chamfered portion may be mirror polished after mirror polishing the front surface of the wafer. This is performed to chiefly mirror polish the chamfered portion for preventing particles from being generated, but does not vary the chamfering shape in the process.

The present inventors have focused on the chamfering process and envisaged that when the front surface side is chamfered again after mirror polishing the front surface of the wafer, part or all of the polishing sag portion can be included into the chamfering width, thereby making it possible to reduce polishing sag.

When the front surface side is not chamfered at all before polishing the front surface, the possibility of generating cracks or fractures becomes high during the other processes. The chamfering width previously provided in the chamfered portion of the front surface side before polishing the front surface of the wafer is smaller than the chamfering width of the back surface. Cracks and fractures can be prevented from being generated, and polishing sag can be reduced.

The above-mentioned method is applied to a method for manufacturing a bonded SOI wafer or a direct bond wafer. It is thus possible to manufacture a bonded wafer having an SOI layer or a bond layer which has no periphery removing region or reduces it.

In a method for manufacturing an SOI wafer, polishing sag of the peripheral portion is reduced. When the thickness of the SOI layer is below 1 $\mu$m, without performing chamfering so as to increase the chamfering width of the front surface side of the SOI layer, the chamfered portion of the front surface of at least the SOI layer side is mirror chamfered or is mirror chamfered after tape polishing or soft grinding. It is thus possible to manufacture a bonded wafer having an SOI layer which has no periphery removing region or reduces it.

BEST MODE FOR CARRYING OUT THE INVENTION

Embodiments of the present invention will be described with reference to the drawings. The present invention, however, is not limited to these.

Figure 1:
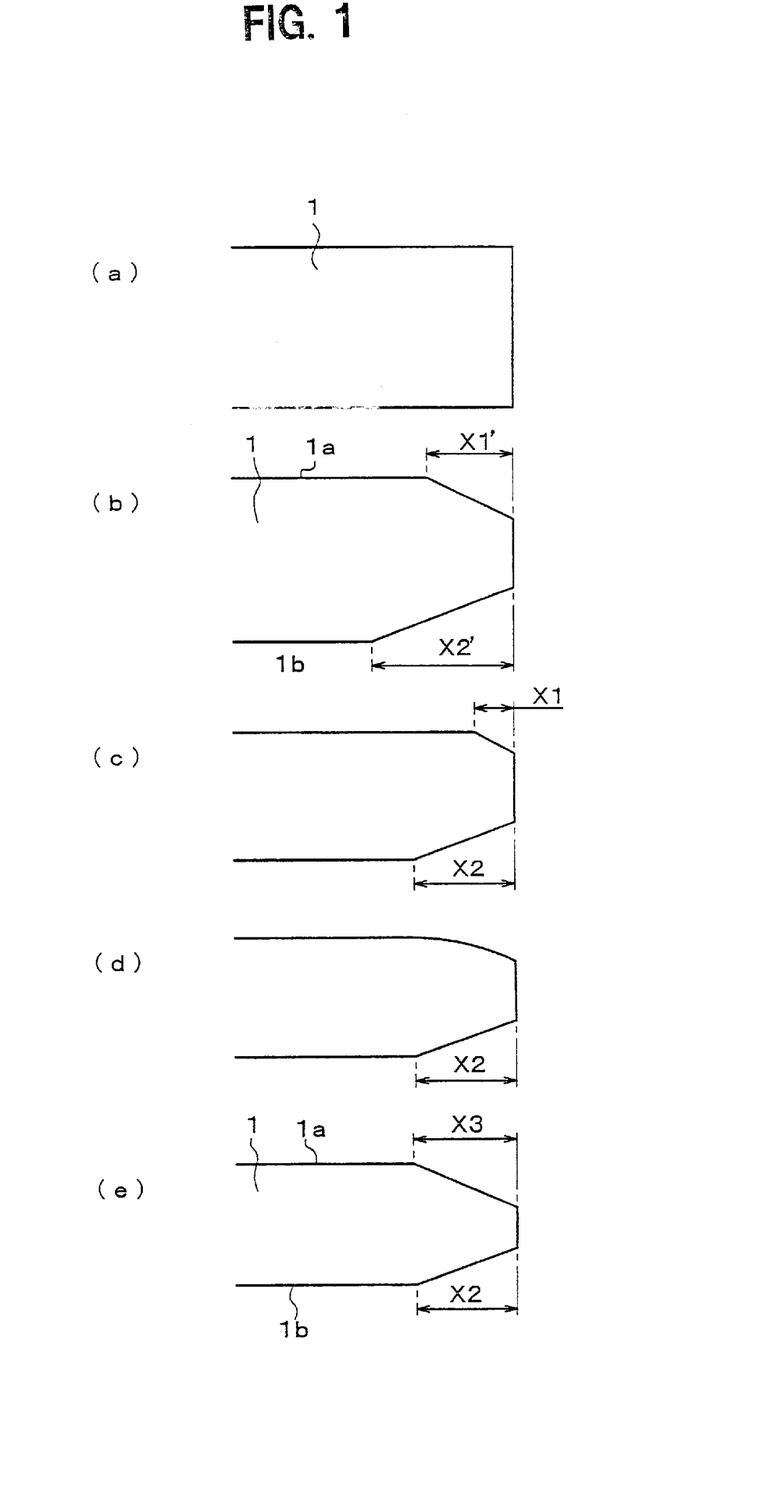
FIG. 1 is a flowchart showing Embodiment 1 of a silicon wafer manufacturing method according to the present invention.

FIG. 1 is a manufacturing process flowchart showing <Embodiment 1> of a silicon wafer manufacturing method according to the present invention.

In step (a), a slice wafer 1 is provided by slicing a silicon single crystal ingot in a wafer shape using a wire saw or an inner diameter slicer. In order to prevent cracks or fractures of the sliced silicon wafer 1, the peripheral portions of the front and back surface sides of the wafer 1 are chamfered.

As shown in step (b), the chamfering is performed so that when the chamfering width of a front surface side 1a is X1' and the chamfering width of a back surface side 1b is X2' the chamfering width X2' of the back surface side 1b is larger than the chamfering width X1' of the front surface side 1a. The front surface side 1a and the back surface side 1b may be chamfered at the same time using a diamond grinding wheel, or the front surface side 1a and the back surface side 1b may be chamfered separately.

After the peripheral portions of the silicon wafer 1 are chamfered, lapping and etching are performed in step (c) so as to enhance flatness and to remove processing deformation.

In the lapping to remove the deformed layer (warpage) of the wafer surface generated by slicing and to enhance the flatness, a wafer is placed between two parallel tables, a lapping solution containing aluminum oxide abrasive grains is poured thereinto, and the tables are pressurized and rotated to lap both the wafer surfaces.

This lapping plays a roll in removing to some degree the surface layer having processing deformation generated by slicing and reducing the thickness variation. Since only the lapping cannot thoroughly remove processing deformation, chemical etching for removing the processing deformation layer is performed after the lapping.

In the etching, an acid solution (a mixing solution of hydrofluoric acid, nitric acid, and acetic acid) or an alkaline solution (an aqueous solution of NaOH) is used to etch the surface to the thickness of tens of $\mu$m from the surface. With the lapping and etching, the chamfering widths of the front surface side 1a and the back surface side 1b are respectively X1'→X1 (X1'>X1) and X2'→X2 (X2'>X2). After chamfering is performed again after the lapping, etching may be done.

In step (d), the front surface side 1a of the silicon wafer 1 is mirror polished.

The mirror polishing is performed by combining chemical polishing with a processing solution with mechanical polishing with abrasive grains.

This method is called mechanochemical polishing, and uses an abrasive prepared by mixing an alkaline solution such as KOH with colloidal silica and rotates the turn table with a polishing cloth such as artificial leather attached while applying suitable pressure thereto.

In the mirror polishing, a hard silicon wafer is mirror finished using a soft polishing cloth, generating polishing sag as shown in FIG. 5 in the peripheral portion of the wafer.

Since the mirror polishing is performed using a hard polishing cloth and polishing pressure is increased, the effect of the mechanical polishing becomes higher, thereby obtaining a surface having good flatness. However, polishing damage or deformation remains easily.

After the front surface side 1a of the silicon wafer 1 is mirror polished, the peripheral portion of the front surface side 1a is chamfered in step (e) so that a chamfering width thereof is X3 (X3>X1).

The chamfering can be performed with the above-mentioned diamond grinding wheel. When processing deformation remaining in the chamfered portion after being subjected to the chamfering must be removed, a mirror chamfering process may be added. This allows part or all of the polishing sag portion to be included within the range of the chamfering width X3, and polishing sag can be reduced. In this case, when X3=X2, it is possible to manufacture a wafer having the same chamfering widths of the front and back surfaces.

In place of the lapping and etching processes of the step (c), or after the lapping and etching, the front surface side 1a is surface ground, alkaline etching of about 1 to 5 $\mu$m is performed thereto, and mirror polishing of stock removal below 2 $\mu$m is performed in the mirror polishing process of the step (d). Polishing sag of the peripheral portion of the wafer 1 can be reduced to a minimum, and a surface without processing deformation can be obtained.

Embodiment 2

Embodiment 2 shows a method for manufacturing a bonded SOI wafer according to the present invention. The manufacturing process will be described based on FIGS. 1 and 2.

First, two silicon wafers to be bonded are prepared. The two silicon wafers 1 and 2 are subjected to the steps (a) to (d) in the same manner as in <Embodiment 1> to prepare two mirror polished wafers.

Figure 2:
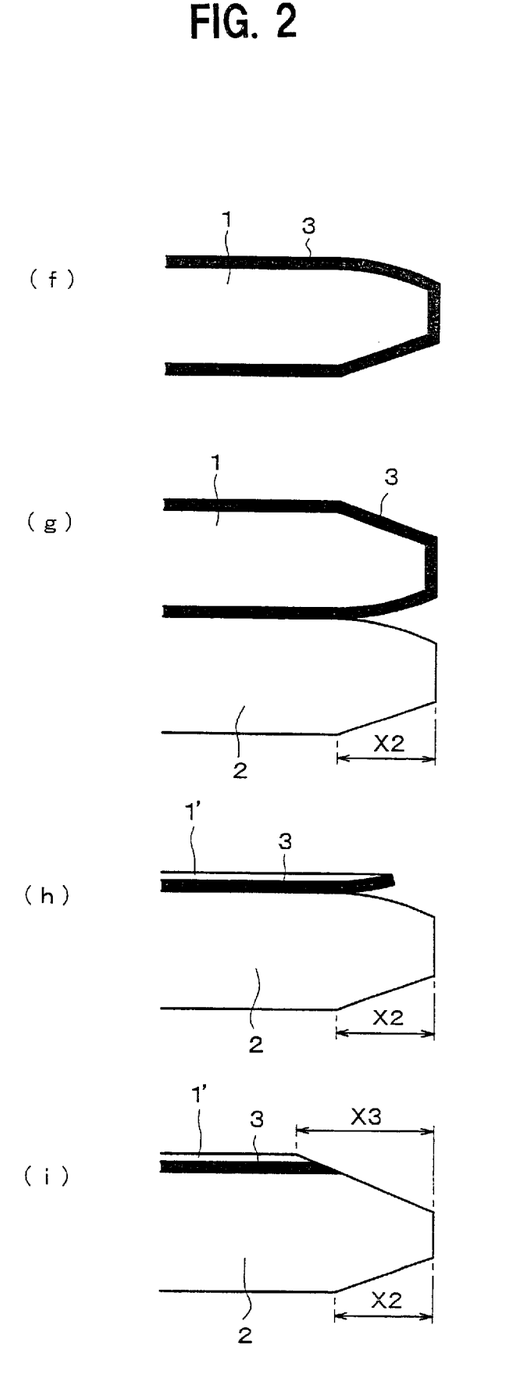
FIG. 2 is a flowchart showing Embodiment 2 of a bonded SOI wafer manufacturing method according to the present invention.

Then, in step (f), one of the two wafers (the bond wafer) 1 is thermally oxidized to form an oxide film 3 on the surface. The oxide film 3 becomes a buried oxide layer of an SOI wafer. The thickness is set depending on the application, and about 0.1 to 2.0 $\mu$m are typically selected. The oxide film 3 may be applied not only to the bond wafer 1 but also to the base wafer 2.

In step (g), the mirror polished surfaces of the one wafer and the other wafer (the base wafer) 2 are closely contacted with each other via the oxide film 3 at room temperature in a clean atmosphere. The wafers 1 and 2 closely contacted with each other are subjected to a heat treatment to enhance the bonding strength. The heat treatment temperature is preferably above 1000° C., more preferably above 1100° C.

In step (h), in the thickness reducing process of the bond wafer 1, the bond wafer 1 is ground and polished from the front surface side thereof in the thickness direction to a desired thickens and is finished to a predetermined thickness of an SOI layer 1'. It is also possible to manufacture an SOI wafer having high film thickness uniformity by vapor phase etching (for example, a method called a PACE method described in No. 2565617 publication) after grinding and polishing.

Step (i) is a chamfering process for chamfering the peripheral portion of the front surface side (the SOI layer 1' side) of the SOI wafer so as to provide the chamfering width X3 (X3>X1) to remove the polishing sag portion (the unbonded region between the bond wafer and the base wafer) of the peripheral portion of the SOI layer 1' and the peripheral portion of the front surface side of the base wafer 2. The chamfering is performed with the above-mentioned diamond grinding wheel, and etching or mirror chamfering for removing processing deformation can be added as needed. In this case, X3≧X2 is preferable in order to reliably remove the unbonded region. Final polishing of the SOI layer surface can be performed after the chamfering. The SOI layer has a thickness of about tens of $\mu$m, and will hardly affect the chamfering width.

Embodiment 3

Figure 3:
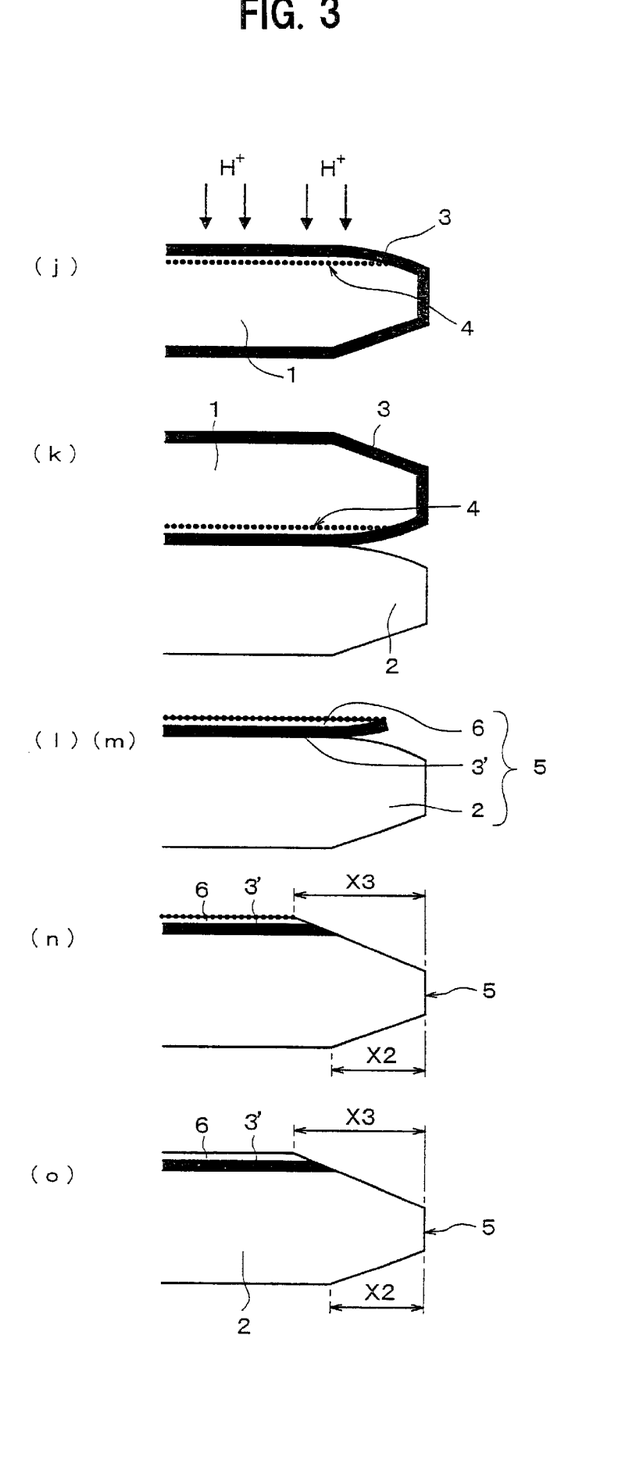
FIG. 3 is a flowchart showing Embodiment 3 of a bonded SOI wafer manufacturing method according to the present invention.

In Embodiment 3, a process for manufacturing a bonded SOI wafer for reducing the thickness of an SOI layer by an ion implantation separation method will be described based on FIGS. 3(j) to 3(o).

First, two silicon wafers to be bonded are prepared. The two silicon wafers 1 and 2 are subjected to the steps (a) to (d) of FIG. 1 and the step (f) of FIG. 2 in the same manner as in <Embodiment 2> to prepare two wafers Then, in step (j), at least one of hydrogen ions and rare gas ions (here, hydrogen ions) are implanted via the oxide film into the bond wafer from its upper surface of one of the surfaces (the surface to be bonded to the base wafer 2) of the bond wafer 1 forming the oxide film 3, and a fine bubble layer (enclosed layer) 4 in parallel with the surface at the ion average penetration depth is formed inside the silicon wafer. The ion implantation dosage is preferably $5\times10^{16}$ atoms/cm$^2$ or more.

The ion implantation into the bond wafer 1 may be performed not only to the bond wafer forming the oxide film but also to the wafer which has completed the step (d). In this case, the oxide film is previously formed on the surface of the base wafer 2 contacted with the bond wafer 1.

Step (k) is a step for superposing and contacting the ion-implanted surface side (the front surface side 1a) of the ion-implanted bond wafer 1 onto the front surface side 2a of the other wafer 2 (the base wafer). The surfaces of the two wafers are contacted with each other at room temperature in a clean atmosphere so that the wafers are contacted with each other without using an adhesive.

Step (l) is a separation heat treatment process in which the bond wafer is separated at the boundary of the enclosed layer formed by ion implantation so as to separate a separating wafer, not shown, from an SOI wafer 5 (an SOI layer 6+a buried oxide layer 3'+the base wafer 2). A heat treatment is added at temperatures of about 400 to 600° C. in an inert gas atmosphere or in an oxidizing gas atmosphere. Crystal rearrangement and bubble aggregation separate the separating wafer from the SOI wafer 5, and the contacted surfaces at room temperature are firmly bonded to some degree.

In order to use the SOI wafer 5 in the device fabrication process, the bonding force obtained by the separation heat treatment of the step (l) is not enough. The SOI wafer 5 is subjected to a heat treatment at high temperatures as the bonding heat treatment of step (m) so as to sufficiently enhance the bonding strength. This heat treatment is done in an inert gas atmosphere or in an oxidizing gas atmosphere, preferably at temperatures above 1000° C., more preferably above 1100° C. When a rapid heating and cooling apparatus such as a lamp heater is used, a sufficient bonding strength can be obtained at temperatures of 1000 to 1350° C. for a short time of about 1 to 300 seconds.

When the bonding heat treatment of the step (m) serves as the separation heat treatment of the step (l), the step (l) can be omitted.

Step (n) is a chamfering step for chamfering the peripheral portion of the front surface side (the SOI layer 6 side) of the SOI wafer 5. As in Embodiment 2, the SOI wafer 5 is chamfered so as to provide the chamfering width X3 (X3>X1, preferably X3≧X2) to remove the polishing sag portion (the unbonded region between the bond wafer and the base wafer) of the peripheral portion of the SOI layer 6 and the peripheral portion of the front surface side 2a of the base wafer 2. The SOI layer is about 1 $\mu$m, and will hardly affect the chamfering width.

Step (o) is a mirror polishing process for removing a damage layer or surface roughness generated by ion implantation existing in the cleaved plane (the separated plane) as the surface of the SOI layer as needed. In this step, polishing called touch polish with very small amount of stock removal (stock removal of about 5 to hundreds of nm) is done.

With the above-mentioned steps, it is possible to manufacture a bonded SOI wafer having no periphery removing region.

Embodiment 4

In <Embodiment 2>, the peripheral portion of the front surface side of the SOI wafer is chamfered in the step (i) of FIG. 2 so that the chamfering width is X3 (X3>X1). In <Embodiment 4>, the peripheral portion of the SOI layer 1' and the chamfered portion of the front surface side of the base wafer 2 are mirror chamfered. The unbonded region of the SOI layer is removed, and the chamfered portion of the base wafer is flattened.

Figure 6:
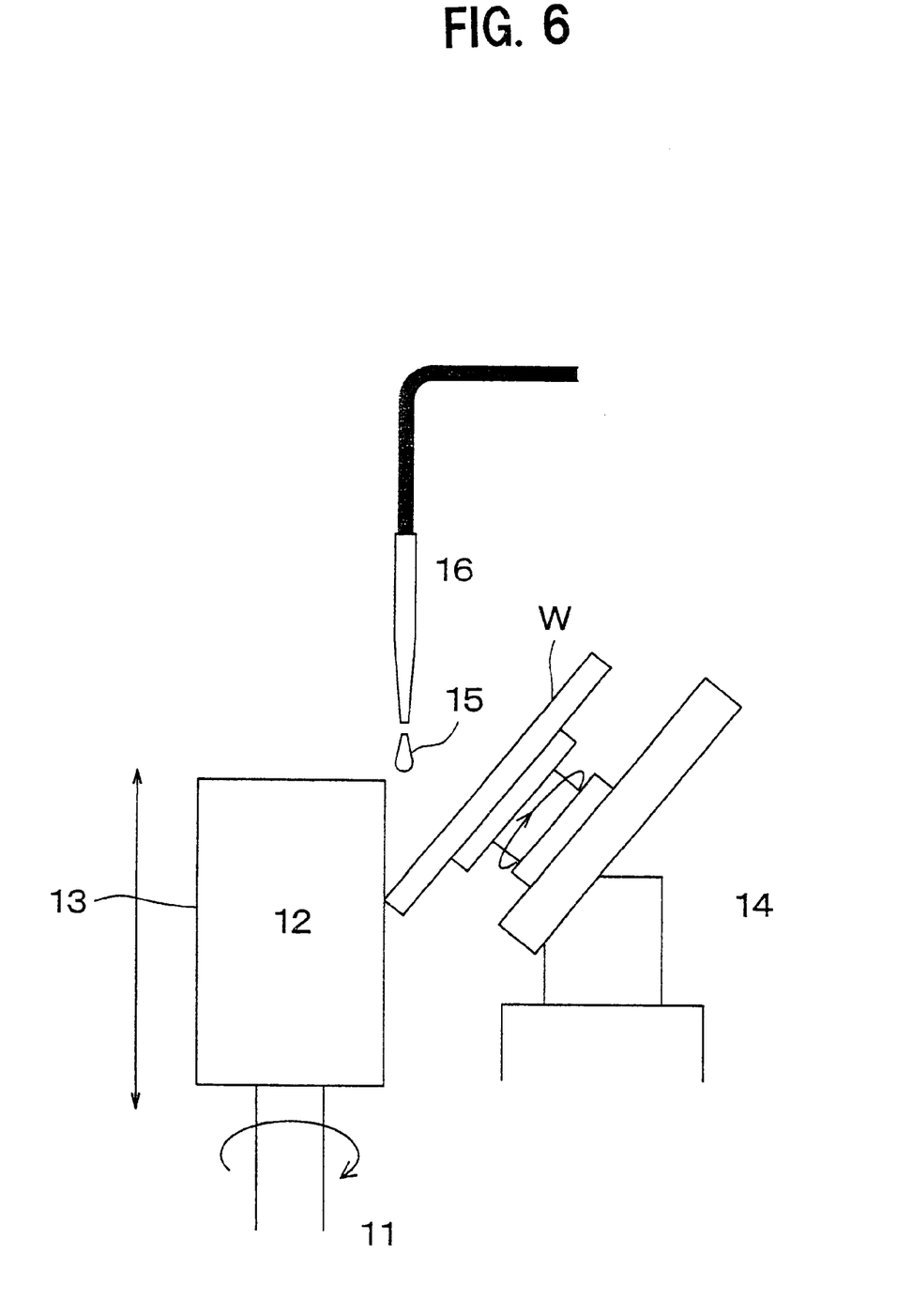
FIG. 6 is a schematic diagram showing an example of an edge polisher.

FIG. 6 is an example of an edge polisher usable in this embodiment.

An edge polisher 11 presses an inclined wafer W onto a surface 13 of a cylindrical polishing cloth 12, and rotates both while supplying an abrasive 15 from an abrasive supply nozzle 16 so as to mirror polish the chamfered portion.

Mirror chamfering is performed at an angle so that the peripheral portion of the SOI layer 1' of the SOI wafer obtained in the step (h) of FIG. 2 is contacted onto the surface 13 of the cylindrical polishing cloth 12. The unbonded region of the periphery of the SOI layer 1' is removed. Mirror chamfering is performed as needed at an angle so that the chamfered portion of the base wafer 2 is contacted onto the surface 13 of the cylindrical polishing cloth 12. The chamfered portion of the base wafer 2 becomes a mirror surface. In this case, the width X1 of the chamfered portion of the SOI layer side of the base wafer 2 is hardly changed. When the polishing sag of the peripheral portion of the wafer is small, this method can also greatly reduce the periphery removing region.

Before the mirror chamfering, tape polishing can be also done at an angle so that a tape holding abrasive grains is contacted onto the peripheral portion of the SOI layer 1' and the chamfered portion of the base wafer 2. As a device used for tape polishing, a device as disclosed in Japanese Laid-Open Patent Publication No. Hei 8-168946 can be used.

In addition, before the mirror chamfering, it is possible to perform soft grinding in which in place of the cylindrical polishing cloth 12, the device of FIG. 6 uses a cylindrical grindstone, the pressing force of the wafer and the grindstone is constant, and grinding is performed while supplying a polishing solution.

The tape polishing and soft grinding cannot greatly change the width of the chamfered portion, but can slightly increase it depending on selection of the conditions. When the thickness of the SOI layer is thick and several microns, tape polishing or soft grinding is preferably done before the mirror chamfering.

Also in this embodiment, final polishing of the SOI layer can be done after the mirror chamfering.

Embodiment 5

In <Embodiment 3>, the peripheral portion of the front surface side of the SOI wafer is chamfered in the step (n) of FIG. 3 so that the chamfering width is X3 (X3>X1). In <Embodiment 5>, as in <Embodiment 4>, the peripheral portion of the SOI layer 6 and the chamfered portion of the front surface side of the base wafer 2 are mirror chamfered. The unbonded region of the SOI layer is removed, and the chamfered portion of the base wafer is flattened.

As an edge polisher usable in this embodiment, the device of FIG. 6 explained in the above-mentioned <Embodiment 4> can be used.

Mirror chamfering is performed at an angle so that the peripheral portion of the SOI layer 6 of the SOI wafer obtained in the step (m) of FIG. 3 is contacted onto the surface 13 of the cylindrical polishing cloth 12. The unbonded region of the periphery of the SOI layer 6 is removed. Mirror chamfering is performed as needed at an angle so that the chamfered portion of the base wafer 2 is contacted onto the surface 13 of the cylindrical polishing cloth 12. The chamfered portion of the base wafer 2 becomes a mirror surface. In this case, the width X1 of the chamfered portion of the SOI layer side of the base wafer 2 is hardly changed. When the polishing sag of the peripheral portion of the wafer is small, this method can also greatly reduce the periphery removing region.

In Embodiment 5, as in the above-mentioned <Embodiment 4>, before the mirror chamfering, tape polishing can be also done at an angle so that a tape holding abrasive grains is contacted onto the peripheral portion of the SOI layer 6 and the chamfered portion of base wafer 2. In this case, as a device used for tape polishing, a device as disclosed in Japanese Laid-open Patent Publication No. Hei 8-168946 can be used.

Embodiment 6

Embodiment 6 is a direct bond wafer manufacturing method, and is almost the same as <Embodiment 2> except that silicon wafers are directly bonded together without interposing an oxide film. The manufacturing process will be described hereinbelow based on FIGS. 7(g') to 7(i').

First, two silicon wafers to be bonded are prepared. The two silicon wafers 1 and 2 are subjected to the (a) to (d) steps in the same manner as in <Embodiment 1> to prepare two mirror polished wafers.

Figure 7:
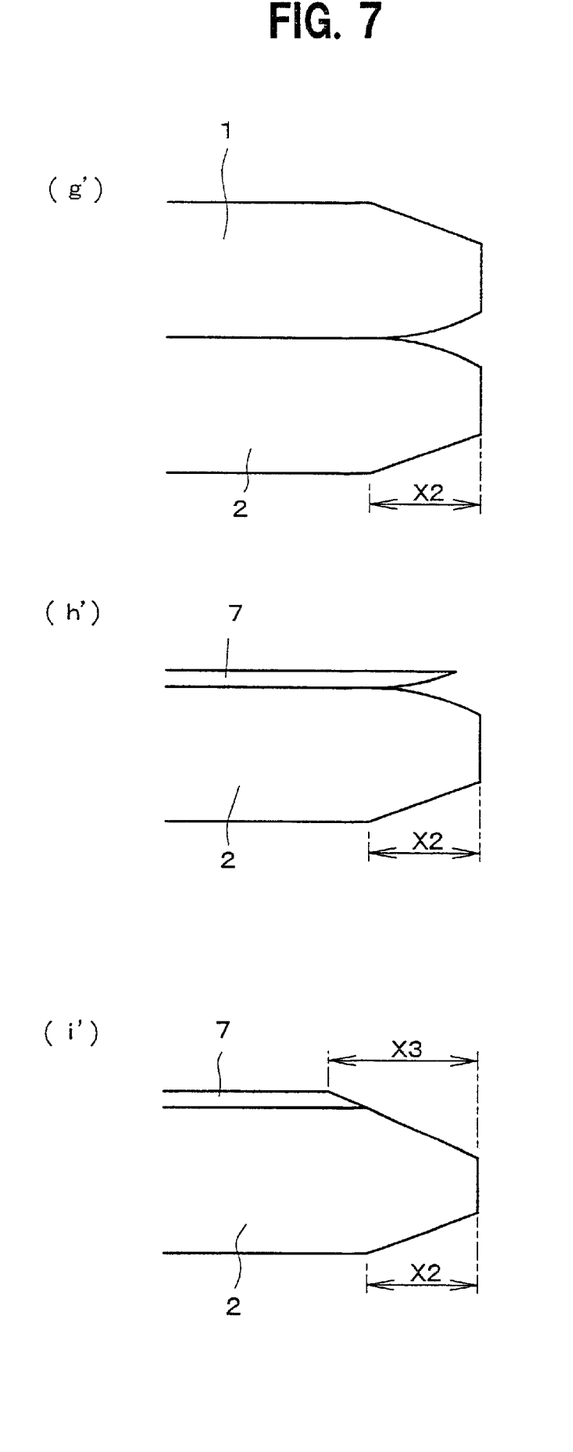
FIG. 7 is a flowchart showing Embodiment 6 of a direct bond wafer manufacturing method according to the present invention.

The mirror polished surfaces of the two silicon wafers (the bond wafer 1 and the base wafer 2) prepared in step (g') are closely contacted with each other at room temperature in a clean atmosphere. The contacted wafers are subjected to a heat treatment to enhance the bonding strength. The heat treatment temperature is preferably above 1000° C., more preferably above 1100° C.

Subsequently, in step (h'), the thickness of one of the wafers (the bond wafer 1) is reduced. As in <Embodiment 2>, the bond wafer 1 is ground and polished from its front surface side in the thickness direction to a desired thickness and is finished to a predetermined bond layer thickness. In addition, vapor phase etching (for example, a method called the PACE method) can be done after the grinding and polishing so as to manufacture a direct bond wafer having high film thickness uniformity.

In step (i'), as in <Embodiment 2>, there is performed a chamfering process for chamfering the peripheral portion of the front surface side (the bond layer side) of the direct bond wafer. Chamfering is done to provide the chamfering width X3 (X3>X1) to remove the polishing sag portion (the unbonded region between the bond wafer and the base wafer) of the peripheral portion of a bond layer 7 and the peripheral portion of the front surface side of the base wafer 2. The chamfering is done with the above-mentioned diamond grinding wheel, and etching or mirror chamfering for removing processing deformation can be added as needed. In this case, X3≧X2 is preferable in order to reliably remove the unbonded region. Final polishing of the surface of the bond layer 7 can be done after the chamfering.

Embodiment 7

Embodiment 7 is a direct bond wafer manufacturing method, and is almost the same as <Embodiment 3> except that silicon wafers are directly bonded together without interposing an oxide film. The manufacturing process will be described hereinbelow based on FIGS. 8(j') to 8(o').

First, two silicon wafers to be bonded are prepared. The two silicon wafers 1 and 2 are subjected to the (a) to (d) steps in the same manner as in <Embodiment 1> to prepare two mirror polished wafers.

Figure 8:
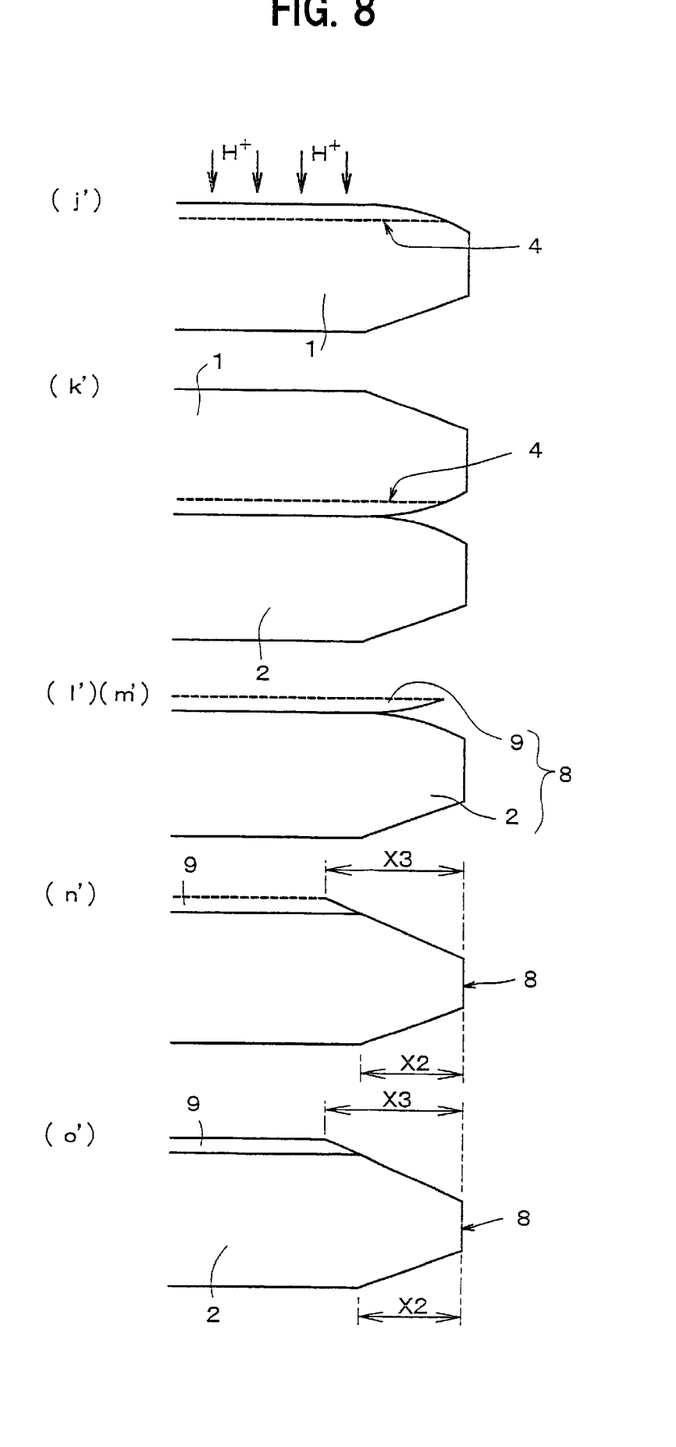
FIG. 8 is a flowchart showing Embodiment 7 of a direct bond wafer manufacturing method according to the present invention.

Then, at least one of hydrogen ions and rare gas ions (here, hydrogen ions) are implanted from its upper surface of one of the surfaces (the surface bonded to the base wafer) of one (the bond wafer 1) of the two silicon wafers (the bond wafer and the base wafer) prepared in step (j'), and a fine bubble layer (enclosed layer) 4 in parallel with the surface at the ion average penetration depth is formed inside the silicon wafer. The ion implantation dosage is preferably $5 \times 10^{16}$ atoms/cm$^2$ or more.

Step (k') is a process for superposing and contacting the ion-implanted bond wafer 1 onto the front surface side of the other wafer (the base wafer 2). The surfaces of the two wafers are closely contacted with each other at room temperature in a clean atmosphere so that the wafers are contacted with each other without using an adhesive.

Step (l') is a separation heat treatment process in which the bond wafer is separated at the boundary of the enclosed layer formed by the ion implantation so as to separate a separating wafer, not shown, from a direct bond wafer 8 (the bond layer 7+the base wafer 2). A heat treatment is added at temperatures of about 400 to 600° C. in an inert gas atmosphere or in an oxidizing gas atmosphere. Crystal rearrangement and bubble aggregation separate the separating wafer from the direct bond wafer 8, and the contacted surfaces at room temperature are firmly bonded to some degree.

In order to use the direct bond wafer 8 in the device fabrication process, the bonding force obtained by the separation heat treatment of the step (l') is not enough. The direct bond wafer 8 is subjected to a heat treatment at high temperatures as the bonding heat treatment of step (m') so as to sufficiently enhance the bonding strength. This heat treatment is done in an inert gas atmosphere or in an oxidizing gas atmosphere preferably at temperatures of above 1000° C., more preferably above 1100° C. When a rapid heating and cooling apparatus such as a lamp heater is used, a sufficient bonding strength can be obtained at temperatures of 1000 to 1350° C. for a short time of about 1 to 300 seconds.

When the bonding heat treatment of the step (m') serves as the separation heat treatment of the step (l'), the step (l') can be omitted.

Step (n') is a chamfering step for chamfering the peripheral portion of the front surface side (a bond layer 9 side) of the direct bond wafer 8. As in Embodiment 2, the direct bond wafer 8 is chamfered so as to provide the chamfering width X3 (X3>X1, preferably X3≧X2) to remove the polishing sag portion (the unbonded region between the bond wafer and the base wafer) of the peripheral portion of the bond layer 9 and the peripheral portion of the front surface side 2a of the base wafer 2. The bond layer is about 1 $\mu$m, and will hardly affect the chamfering width.

Step (o') is a mirror polishing process for removing a damage layer or surface roughness generated by ion implantation existing in the cleaved plane (the separated plane) as the surface of the bond layer as needed. In this step, polishing called touch polish with very small amount of stock removal (stock removal of about 5 to hundreds of nm) is done.

With the above-mentioned steps, it is possible to manufacture a bonded wafer which has no periphery removing region or reduces it.

Embodiment 8

In <Embodiment 6>, the peripheral portion of the front surface side of the direct bond wafer is chamfered in the step (i') of FIG. 7 so that the chamfering width is X3 (X3>X1). In <Embodiment 8>, the peripheral portion of the bond layer 7 and the chamfered portion of the front surface side of the base wafer 2 are mirror chamfered. The unbonded region of the bond layer is removed, and the chamfered portion of the base wafer is flattened.

As an edge polisher usable in this embodiment, the edge polisher of FIG. 6 explained in the above-mentioned Embodiment 4 can be used, and the detailed description thereof is omitted.

Mirror chamfering is performed at an angle so that the peripheral portion of the bond layer 7 of the direct bond wafer obtained in the step (h') of FIG. 7 is contacted onto the surface 13 of the cylindrical polishing cloth 12. The unbonded region of the periphery of the bond layer 7 is removed. Mirror chamfering is performed as needed at an angle so that the chamfered portion of the base wafer 2 is contacted onto the surface 13 of the cylindrical polishing cloth 12. The chamfered portion of the base wafer 2 becomes a mirror surface. In this case, the width X1 of the chamfered portion of the bond layer side of the base wafer 2 is hardly changed. When the polishing sag of the peripheral portion of the wafer is small, this method can also greatly reduce the periphery removing region.

Before the mirror chamfering, tape polishing can be also done at an angle so that a tape holding abrasive grains is contacted onto the peripheral portion of the bond layer 7 and the chamfered portion of the base wafer 2. As a device used for tape polishing, a device as disclosed in the above-mentioned Japanese Laid-Open Patent Publication No. Hei 8-168946 can be used.

In addition, before the mirror chamfering, it is possible to perform soft grinding in which in place of the cylindrical polishing cloth 12, the device of FIG. 6 uses a cylindrical grindstone, the pressing force of the wafer and the grindstone is constant, and grinding is performed while supplying an abrasive.

The tape polishing and soft grinding cannot greatly change the width of the chamfered portion, but can slightly increase it depending on selection of the conditions. When the thickness of the bond layer is thick and several microns, tape polishing or soft grinding is preferably done before the mirror chamfering.

Also in this embodiment, final polishing of the SOI layer can be done after the mirror chamfering.

Embodiment 9

In <Embodiment 7>, the peripheral portion of the front surface side of the direct bond wafer is chamfered in the step (n') of FIG. 8 so that the chamfering width is X3 (X3>X1). In <Embodiment 9>, as in <Embodiment 8>, the peripheral portion of the bond layer 9 and the chamfered portion of the front surface side of the base wafer 2 are mirror chamfered. The unbonded region of the bond layer is removed, and the chamfered portion of the base wafer is flattened.

As an edge polisher usable in this embodiment, the device of FIG. 6 explained in the above-mentioned <Embodiment 4> can be used.

Mirror chamfering is performed at an angle so that the peripheral portion of the bond layer 9 of the direct bond wafer 8 obtained in the step (m') of FIG. 8 is contacted onto the surface 13 of the cylindrical polishing cloth 12. The unbonded region of the periphery of the bond layer 9 is removed. Mirror chamfering is performed as needed at an angle so that the chamfered portion of the base wafer 2 is contacted onto the surface 13 of the cylindrical polishing cloth 12. The chamfered portion of the base wafer 2 becomes a mirror surface. In this case, the width X1 of the chamfered portion of the bond layer 9 side of the base wafer 2 is hardly changed. When the polishing sag of the peripheral portion of the wafer is small, this method can also greatly reduce the periphery removing region.

In Embodiment 9, as in the above-mentioned <Embodiment 8>, before the mirror chamfering, tape polishing can be also done at an angle so that a tape holding abrasive grains is contacted onto the peripheral portion of the bond layer 9 and the chamfered portion of base wafer 2. In this case, as a device used for tape polishing, a device as disclosed in Japanese Laid-Open Patent Publication No. Hei 8-168946 can be used.

EXAMPLE

A silicon single crystal ingot is sliced using a wire saw to manufacture silicon wafers having a diameter of 150 mm.

The peripheral portions of these wafers are chamfered using a diamond grinding wheel whose grain size is No. 1500 (JIS) so that the chamfering width (X1') of the front surface side is 350 $\mu$m and that the chamfering width (X2') of the back surface side is 500 $\mu$m (the chamfering angle is about 20°).

There is performed a lapping process (the lapping stock removal of the single surface is about 50 $\mu$m) in which the chamfered wafers are pressurized and rotated with a slurry containing No. 1200 loose abrasives of aluminum oxide. Thereafter, a mixed acid solution (an aqueous solution mixing nitric acid, hydrofluoric acid, and acetic acid) is used to etch the single surface by about 20 $\mu$m, thereby removing the lapping processing deformation.

After surface grinding (No. 2000) is performed by about 10 $\mu$m to only the front surface side, the entire surface is alkali etched by about 2 $\mu$m with an aqueous solution of NaOH. In the chamfering width at this point, X1 is about 130 $\mu$m, and X2 is about 300 $\mu$m. Finally, the front surface side is subjected to mechanochemical polishing by about 2 μm to manufacture mirror polished wafers with very little polishing sag.

Two wafers (the bond wafer and the base wafer) are taken out from the manufactured wafers A thermal oxide film of 400 nm is formed on its surface as the bond wafer. Hydrogen ions are implanted via the oxide film. The implantation energy is 90 keV, and the implantation dosage is $8 \times 10^{16}$ atoms/cm$^3$.

The ion-implanted bond wafer and base wafer are closely contacted with each other at room temperature, and then, are subjected to a heat treatment at 500° C. for 30 minutes in a nitrogen atmosphere. As a result, the bond wafer is separated at the ion-implanted layer to manufacture an SOI wafer having an SOI layer with a thickness of about 0.4 μm.

In order to enhance the bonding strength of the SOI wafer, the SOI wafer is subjected to a heat treatment at 1100° C. for two hours. The peripheral portion thereof is then observed under a microscope to measure a distance between the peripheral edge of the base wafer and the peripheral edge of the SOI layer. The distance is about 300 μm.

The mirror polished wafers with little polishing sag according to the method of the present invention are used as the bond wafer and the base wafer. The unbonded width of the bonded wafer is found to be smaller than usual.

The chamfered portion of the SOI layer side of the bonded SOI wafer is chamfered corresponding to about 300 μm which is the chamfering width of the back surface side. The chamfering is performed using a No. 1500 diamond grinding wheel. To remove the processing deformation, mirror chamfering is thus performed. Finally, in order to remove the ion implantation damage layer and surface roughness remaining in the SOI layer surface, polishing with small amount of stock removal (stock removal of about 0.1 μm) is performed. A bonded SOI wafer having no periphery removing region is manufactured.

The present invention is not limited to the above-mentioned embodiments. The above-mentioned <Embodiment 3> and <Embodiment 5> describe a process for manufacturing an SOI wafer by bonding two silicon wafers together via an oxide film using the ion implantation separation method. The present invention can be applied not only to another method for manufacturing a bonded wafer, that is, the case of bonding silicon wafers together but also to the case of implanting ions into a silicon wafer, and bonding the silicon wafer directly to an insulator wafer such as SiO$_2$, SiC, or Al$_2$O$_3$ to manufacture an SOI wafer.

The above-mentioned embodiments describe that in the hydrogen-ion separation method, the wafer is subjected to a heat treatment to be separated. The present invention is also applicable to the hydrogen-ion implantation separation method in which hydrogen ions are excited to perform ion implantation in a plasma state, thereby separating the wafer at room temperature without performing a special heat treatment.

When chamfering or mirror chamfering is performed after mirror polishing or forming an SOI layer or a bond layer, after mirror polishing or coating the surface of the SOI layer or the bond layer with a thin film of a resin such as polyvinyl butyral, chamfering or mirror chamfering can be performed to protect the surface and to process the edge portion.

Polyvinyl butyral can be preferably used because a thin film can be removed during cleaning. A resin is not limited to this. It is possible to use any resin which can be easily formed a thin film on the silicon surface and can be removed the thin film in a cleaning process typically used for a silicon wafer.

INDUSTRIAL APPLICABILITY

The silicon wafer manufacturing method of the present invention can obtain a silicon wafer which can reduce polishing sag (peripheral sag) as compared with the prior art.

In addition, the bonded SOI wafer manufacturing method of the present invention can reduce the unbonded width of a bonded SOI wafer, and can obtain a bonded SOI wafer which has no periphery removing region or reduces it.

There can be provided a bonded SOI wafer having an SOI layer which has no periphery removing region or reduces it.

Further, the bonded wafer manufacturing method of the present invention can reduce the unbonded width of a direct bond wafer, and can obtain a direct bond wafer which has no periphery removing region or reduces it.

There can be provided a direct bond wafer having a bond layer which has no periphery removing region or reduces it.

What is claimed is:

1. A silicon wafer manufacturing method comprising:
    preparing a silicon wafer having chamfered portions in which when the chamfering width of the front surface side of the silicon wafer is X1 and the chamfering width of the back surface side thereof is X2, X1<X2; mirror polishing the front surface of the silicon wafer; and chamfering the front surface side so that the chamfering width thereof is X3 (X3>X1).

2. A bonded SOI wafer manufacturing method comprising:
    preparing two silicon wafers each having chamfered portions in which when the chamfering width of the front surface side of the silicon wafer is X1 and the chamfering width of the back surface side thereof is X2, X1<X2; mirror polishing the front surfaces of both the wafers; subjecting the wafers closely contacted with each other via an oxide film to a heat treatment; reducing one of the wafers to a desired thickness to manufacture a bonded SOI wafer; and chamfering the front surface of the SOI layer side of the SOI wafer so that the chamfering width thereof is X3 (X3>X1).

3. A bonded SOI wafer manufacturing method comprising:
    preparing two silicon wafers each having chamfered portions in which when the chamfering width of the front surface side of the silicon wafer is X1 and the chamfering width of the back surface side thereof is X2, X1<X2; mirror polishing the front surfaces of both the wafers; implanting at least one of hydrogen ions and rare gas ions into the front surface of one of the wafers (a bond wafer) to form a fine bubble layer (an implanted layer) therein; subjecting the wafer closely contacted with the other wafer (a base wafer) via an oxide film to a heat treatment; separating the bond wafer in a thin film form at the fine bubble layer to manufacture a bonded SOI wafer; and chamfering the front surface of the SOI layer side of the SOI wafer so that the chamfering width thereof is X3 (X3>X1).

4. A bonded SOI wafer manufacturing method comprising:
    preparing two silicon wafers each having chamfered portions in which when the chamfering width of the front surface side of the silicon wafer is X1 and the chamfering width of the back surface side thereof is X2, X1<X2; mirror polishing the front surfaces of both the wafers; subjecting the wafers closely contacted with each other via an oxide film to a heat treatment; reducing one of the wafers to a desired thickness to manufacture a bonded SOI wafer; and mirror chamfering the chamfered portion of the front surface of at least the SOI layer side of the SOI wafer.

5. A bonded SOI wafer manufacturing method comprising:

preparing two silicon wafers each having chamfered portions in which when the chamfering width of the front surface side of the silicon wafer is X1 and the chamfering width of the back surface side thereof is X2, X1<X2; mirror polishing the front surfaces of both the wafers, implanting at least one of hydrogen ions and rare gas ions into the front surface of one of the wafers (a bond wafer) to form a fine bubble layer (an implanted layer) therein; subjecting the wafer closely contacted with the other wafer (a base wafer) via an oxide film to a heat treatment; separating the bond wafer in a thin film form at the fine bubble layer to manufacture a bonded SOI wafer; and mirror chamfering the chamfered portion of the front surface of at least the SOI layer side of the SOI wafer.

6. The bonded SOI wafer manufacturing method according to claim 4, wherein before performing said mirror chamfering, the chamfered portion of the front surface of the SOI layer side of said SOI wafer is processed by tape polishing or soft grinding.

7. A bonded SOI wafer having no periphery removing region which is manufactured according to claim 2.

8. A bonded wafer manufacturing method comprising:

preparing two silicon wafers each having chamfered portions in which when the chamfering width of the front surface side of the silicon wafer is X1 and the chamfering width of the back surface side thereof is X2, X1<X2; mirror polishing the front surfaces of both the wafers; subjecting the wafers directly contacted with each other to a heat treatment; reducing one of the wafers to a desired thickness to manufacture a bonded wafer; and chamfering the front surface of at least the thickness-reduced layer side of the bonded wafer so that the chamfering width thereof is X3 (X3>X1).

9. A bonded wafer manufacturing method comprising:

preparing two silicon wafers each having chamfered portions in which when the chamfering width of the front surface side of the silicon wafer is X1 and the chamfering width of the back surface side thereof is X2, X1<X2; mirror polishing the front surfaces of both the wafers; implanting at least one of hydrogen ions and rare gas ions into the front surface of one of the wafers (a bond wafer) to form a fine bubble layer (an implanted layer) therein; subjecting the wafer directly contacted with the other wafer (a base wafer) to a heat treatment; separating the bond wafer in a thin film form at the fine bubble layer to manufacture a bonded wafer; and chamfering the front surface of at least the bond wafer side of the bonded wafer so that the chamfering width thereof is X3 (X3>X1).

10. A bonded wafer manufacturing method comprising:

preparing two silicon wafers each having chamfered portions in which when the chamfering width of the front surface side of the silicon wafer is X1 and the chamfering width of the back surface side thereof is X2, X1<X2; mirror polishing the front surfaces of both the wafers; subjecting the wafers directly contacted with each other to a heat treatment; reducing one of the wafers to a desired thickness to manufacture a bonded wafer; and mirror chamfering the chamfered portion of the front surface of at least the thickness-reduced layer side of the bonded wafer.

11. A bonded wafer manufacturing method comprising:

preparing two silicon wafers each having chamfered portions in which when the chamfering width of the front surface side of the silicon wafer is X1 and the chamfering width of the back surface side thereof is X2, X1<X2; mirror polishing the front surfaces of both the wafers; implanting at least one of hydrogen ions and rare gas ions into the front surface of one of the wafers (a bond wafer) to form a fine bubble layer (an implanted layer) therein; subjecting the wafer directly contacted with the other wafer (a base wafer) to a heat treatment; separating the bond wafer in a thin film form at the fine bubble layer to manufacture a bonded wafer; and mirror chamfering the chamfered portion of the front surface of at least the bond wafer side of the bonded wafer.

12. The bonded wafer manufacturing method according to claim 10, wherein before performing said mirror chamfering, the chamfered portion of the front surface of the thickness-reduced layer side or the bond wafer side of said bonded wafer is processed by tape polishing or soft grinding.

13. A bonded wafer having no periphery removing region which is manufactured according to claim 8.

14. The bonded SOI wafer manufacturing method according to claim 5, wherein before performing said mirror chamfering, the chamfered portion of the front surface of the SOI layer side of said SOI wafer is processed by tape polishing or soft grinding.

15. A bonded SOI wafer having no periphery removing region which is manufactured according to claim 3.

16. A bonded SOI wafer having no periphery removing region which is manufactured according to claim 4.

17. A bonded SOI wafer having no periphery removing region which is manufactured according to claim 5.

18. A bonded SOI wafer having no periphery removing region which is manufactured according to claim 6.

19. The bonded wafer manufacturing method according to claim 11, wherein before performing said mirror chamfering, the chamfered portion of the front surface of the thickness-reduced layer side or the bond wafer side of said bonded wafer is processed by tape polishing or soft grinding.

20. A bonded wafer having no periphery removing region which is manufactured according to claim 9.

21. A bonded wafer having no periphery removing region which is manufactured according to claim 10.

22. A bonded wafer having no periphery removing region which is manufactured according to claim 11.

23. A bonded wafer having no periphery removing region which is manufactured according to claim 12.

* * * * *